(12) United States Patent
Li et al.

(10) Patent No.: US 10,991,834 B1
(45) Date of Patent: Apr. 27, 2021

(54) PHOTOVOLTAIC MODULE, SOLAR CELL, AND METHOD FOR PRODUCING SOLAR CELL

(71) Applicants: JINKO GREEN ENERGY (SHANGHAI) MANAGEMENT CO., LTD, Shanghai (CN); ZHEJIANG JINKO SOLAR CO., LTD, Zhejiang (CN)

(72) Inventors: Wenqi Li, Shanghai (CN); Jie Yang, Shanghai (CN); Xueting Yuan, Shanghai (CN); Xinyu Zhang, Shanghai (CN); Hao Jin, Shanghai (CN)

(73) Assignees: JINKO GREEN ENERGY (SHANGHAI) MANAGEMENT CO., LTD., Shanghai (CN); ZHEJIANG JINKO SOLAR CO., LTD, Zhejiang (CN)

( * ) Notice: Subject to any disclaimer, the term of this patent is extended or adjusted under 35 U.S.C. 154(b) by 0 days.

(21) Appl. No.: 16/901,242

(22) Filed: Jun. 15, 2020

(30) Foreign Application Priority Data

May 29, 2020 (CN) .......................... 202010477777.2

(51) Int. Cl.
*H01L 31/0216* (2014.01)
*H01L 31/18* (2006.01)

(52) U.S. Cl.
CPC .... *H01L 31/02167* (2013.01); *H01L 31/1868* (2013.01)

(58) Field of Classification Search
None
See application file for complete search history.

(56) References Cited

U.S. PATENT DOCUMENTS

| | | | | |
|---|---|---|---|---|
| 2009/0165855 A1* | 7/2009 | Sun | ...................... | H01L 31/1868 136/261 |
| 2010/0059114 A1* | 3/2010 | Park | ...................... | H01L 31/068 136/256 |
| 2010/0258177 A1* | 10/2010 | Ko | ...................... | H01L 31/02245 136/256 |

(Continued)

FOREIGN PATENT DOCUMENTS

| CN | 101964378 | 2/2011 |
|---|---|---|
| CN | 110473921 | 11/2019 |
| CN | 110491949 | 11/2019 |

OTHER PUBLICATIONS

European Search Report for 20179975.6, dated Aug. 25, 2020.

(Continued)

*Primary Examiner* — Eli S Mekhlin
(74) *Attorney, Agent, or Firm* — Nixon Peabody LLP; Jeffrey L. Costellia (57) ABSTRACT

A solar cell is provided. The solar cell at least includes a semiconductor layer and a plurality of passivation layers provided on a back surface of the semiconductor layer. The passivation layers include a first silicon oxynitride film layer having a first refractive index, a second silicon oxynitride film layer having a second refractive index and provided on a surface of the first silicon oxynitride film layer, and a silicon nitride film layer having a third refractive index and provided on a surface of the second silicon oxynitride film layer.

13 Claims, 4 Drawing Sheets

(56) References Cited

U.S. PATENT DOCUMENTS

2011/0157703 A1* 6/2011 Broadway .............. G02B 1/115
                                                             359/586

OTHER PUBLICATIONS

Soman et al., "Broad range refractive index engineering of $Si_xN_y$ and $SiO_xN_y$ thin films and exploring their potential applications in crystalline silicon solar cells" Materials Chemistry and Physics, vol. 197, May 19, 2017, pp. 181-191.
Chen et al., "Industrially PERC Solar Cells with Integrated Front-Side Optimization", 2018 IEEE $7^{th}$ WCPEC (World Conference on Photovoltaic Energy Conversion), Jun. 10, 2018, pp. 0980-0982.
Somali et al., "Surface Passivation of C—Si Using Silicon Oxynitride-Accentuating the Thermal Stability by Silicon Nitride Capping Layer", $32^{nd}$ European Photovoltaic Solar Energy Conference and Exhibition.
Johannes Sciffc et al., "Surface passivation of crystalline silicon by plasma-enhanced chemical vapor deposition double layers of silicon-rich silicon oxynitride and silicon nitride", Journal of Applied Physics, 2011, vol. 109, pp. 034105-1-034105-12.
Y. Lv et al., "Towards high-efficiency industrial p-type mono-like Si PERC solar cells", Solar Energy Materials & Solar Cells, Oct. 7, 2019, vol. 204, pp. 110202-1-pp. 110202-9.
Xuemei Cheng et al., "Electronic Properties of a-SiOxNy:H/SiNx Stacks for Surface Passivation of P-Type Crystalline Si Wafers", IEEE Journal of Photovoltaics, 2016, vol. 6, pp. 1103-1108.
Japanese Office Action for App. No. 2020-103380, dated Sep. 8, 2020.
Japanese Notice of Allowance for App. No. 2020-103380, dated Oct. 9, 2020.

* cited by examiner

| Examples | Thickness (nm) of first silicon oxynitride film layer | Refractive index of first silicon oxynitride film layer | Power (W) | Thickness (nm) of second silicon oxynitride film layer | Refractive index of second silicon oxynitride film layer | Power (W) | Thickness (nm) of silicon nitride film layer | Refractive index of silicon nitride film layer | Power (W) | Total film thickness (nm) | Efficiency (Eta, %) |
|---|---|---|---|---|---|---|---|---|---|---|---|
| 1 | 20 | 1.68 | 9500 | 20 | 1.58 | 8500 | 80 | 2.10 | 9500 | 100 | -0.24 |
| 2 | 20 | 1.68 | 9500 | 20 | 1.60 | 9500 | 100 | 2.08 | 9500 | 140 | -0.15 |
| 3 | 50 | 1.62 | 8500 | 20 | 1.58 | 9500 | 80 | 2.10 | 9000 | 150 | 0 |
| 4 | 30 | 1.66 | 9000 | 50 | 1.56 | 9500 | 100 | 2.11 | 9500 | 180 | +0.08 |
| 5 | 50 | 1.71 | 9500 | 70 | 1.51 | 9000 | 60 | 2.08 | 9000 | 180 | -0.07 |
| 6 | 70 | 1.71 | 9000 | 70 | 1.61 | 9500 | 40 | 2.08 | 9500 | 180 | -0.21 |

PHOTOVOLTAIC MODULE, SOLAR CELL, AND METHOD FOR PRODUCING SOLAR CELL

CROSS-REFERENCE TO RELATED APPLICATIONS

The present application claims priority to Chinese Patent Application No. 202010477777.2, filed on May 29, 2020, the content of which is incorporated herein by reference in its entirety.

TECHNICAL FIELD

The present disclosure relates to the field of solar cells, and in particular to a photovoltaic module, a solar cell, and a method for producing the solar cell.

BACKGROUND

Currently, an efficiency of a passivated emitter and rear Cell (PERC) can be effectively improved by means of enhancing back passivation characteristics. The existing PERC cells adopt an aluminum oxide/silicon nitride (AlOx/SiNx) stack as the back passivation layer. An aluminum oxide film contains a high fixed negative charge density, and a large number of fixed negative charges may shield electrons on a silicon surface, thereby reducing electrons that can be used for recombination and thus achieving a purpose of suppressing carrier recombination on the surface. Due to the high fixed negative charge density, a strong field passivation effect may be generated, and the aluminum oxide film is therefore considered as a field effect passivation film. Such dielectric film has a good passivation effect on both p-type and n-type substrate surfaces, but resulting in a high equipment cost and a low production capacity and output, which is not conducive to modern industrial mass production.

In addition, potential induced degradation (PID) has a negative impact on the service life and performance of solar cells. A main reason for the potential induced degradation lies in that Na+ ions inside glass of an encapsulating material of the photovoltaic (PV) module migrate to inside of the solar cell along a direction of the solar cell to destroy a p-n junction, leading to an attenuation of the power of the PV module and the reduction of reliability. The PERC cell including the aluminum oxide/silicon nitride stack passivation film is encapsulated by EVA (ethylene-vinyl acetate) into a bifacial photovoltaic module, which involves obvious PID phenomena for its front and back surfaces. The PID phenomenon of the front surface of the photovoltaic module may be alleviated by changing the encapsulating material into a higher-priced polyolefin (POE), but the PID phenomenon of the back surface still exists.

Therefore, it is desirable to develop a solar cell and a method for making the solar cell, which can enhance back passivation characteristics of the solar cell, reduce the PID and the manufacturing costs related to the solar cell.

SUMMARY

In one aspect of the present disclosure, a solar cell may be provided. The solar cell includes: a semiconductor layer and a plurality of passivation layers provided on a back surface of the semiconductor layer. The passivation layers include a first silicon oxynitride film layer having a first refractive index; a second silicon oxynitride film layer having a second refractive index and provided on a surface of the first silicon oxynitride film layer, and at least one silicon nitride film layer having a third refractive index and provided on a surface of the second silicon oxynitride film layer. A sum of thicknesses of the first silicon oxynitride film layer and the second silicon oxynitride film layer is greater than 60 nm, a thickness of the at least one silicon nitride film layer is greater than 60 nm, a sum of thicknesses of the plurality of passivation layers is greater than 120 nm and smaller than 300 nm, and the first refractive index is greater than the second refractive index and smaller than the third refractive index.

In some embodiments, a ratio of the first refractive index to the second refractive index ranges from 1.03 to 1.21.

In some embodiments, a ratio of the first refractive index to the third refractive index ranges from 0.79 to 0.87.

In some embodiments, a ratio of the second refractive index to the third refractive index ranges from 0.72 to 0.77.

In some embodiments, the first refractive index ranges from 1.62 to 1.71.

In some embodiments, the second refractive index ranges from 1.48 to 1.61.

In some embodiments, the third refractive index range ranges from 2.08 to 2.11.

In another aspect of the present disclosure, a photovoltaic module may be provided. The photovoltaic module may include at least one solar cell configured to convert received light energy into electrical energy. Each of the at least one solar cell includes a semiconductor layer and a plurality of passivation layers provided on a back surface of the semiconductor layer. The passivation layers include a first silicon oxynitride film layer having a first refractive index; a second silicon oxynitride film layer having a second refractive index and provided on a surface of the first silicon oxynitride film layer, and at least one silicon nitride film layer having a third refractive index and provided on a surface of the second silicon oxynitride film layer. A sum of thicknesses of the first silicon oxynitride film layer and the second silicon oxynitride film layer is greater than 60 nm, a thickness of the at least one silicon nitride film layer is greater than 60 nm, a sum of thicknesses of the plurality of passivation layers is greater than 120 nm and smaller than 300 nm, and the first refractive index is greater than the second refractive index and smaller than the third refractive index.

In another aspect of the present disclosure, a method for producing a solar cell may be provided. The method includes: sequentially depositing a first silicon oxynitride film layer having a first refractive index, a second silicon oxynitride film layer having a second refractive index, and at least one silicon nitride film layer having a third refractive index on a back surface of a semiconductor layer to form passivation layers. A sum of thicknesses of the first silicon oxynitride film layer and the second silicon oxynitride film layer is greater than 60 nm, a thickness of the at least one silicon nitride film layer is greater than 60 nm, a sum of thicknesses of the plurality of passivation layers is greater than 120 nm and smaller than 300 nm, and the first refractive index is greater than the second refractive index and smaller than the third refractive index.

In some embodiments, the first silicon oxynitride film layer is deposited using reactants including silane, nitrous oxide, and ammonia, wherein a flow rate of the silane ranges from 310 sccm to 380 sccm, a flow rate of the nitrous oxide ranges from 5000 sccm to 6000 sccm, a flow rate of the ammonia ranges from 1600 sccm to 2600 sccm, a deposition temperature ranging from 480° C. to 510° C., and a power ranging from 9000 W to 9500 W.

In some embodiments, the second silicon oxynitride film layer is deposited using reactants including silane, nitrous oxide, and ammonia as, wherein a flow rate of the silane ranges from 280 sccm to 320 sccm, a flow rate of the nitrous oxide ranges from 6000 sccm to 7000 sccm, a flow rate of the ammonia ranges from 300 sccm to 800 sccm, a deposition temperature ranging from 480° C. to 510° C., and a power ranging from 9000 W to 9500 W.

In some embodiments, the at least one silicon nitride film layer is deposited using reactants including silane and ammonia as reactants, wherein a flow rate of the silane ranges from 800 sccm to 1420 sccm, a flow rate of the ammonia ranges from 4000 sccm to 10000 sccm, a deposition temperature ranging from 480° C. to 510° C., and a power ranging from 8500 W to 9500 W.

8 Compared with the solar cell that is passivated with a conventional passivation layer including $Al_2O_3$, the use of passivation film without $Al_2O_3$ can effectively enhance back passivation characteristics of the solar cell, reduce the PID of the photovoltaic module, and lower manufacturing costs. For example, the passivation layers 2 include a large number of hydrogen atoms, which can achieve a good passivation effect. Moreover, the presence of oxygen atoms can also enable silicon oxynitride to have a better interface quality on the silicon surface, which can solve the incompatible contradiction between reliability and lower manufacturing cost of the solar cells. For example, a silicon nitride film layer is provided as the outermost layer of the passivation layers on the back surface of the substrate. Since the silicon nitride film has a high compactness and corrosion resistance after high-temperature sintering, it can prevent Na+ from diffusing and eroding into the film layers, thereby slowing down the PID of the photovoltaic module. In addition, a higher cell efficiency can be obtained based on a preferred relation between the refractive indexes and/or thicknesses of the passivation layers.

DESCRIPTION OF EMBODIMENTS

The embodiments of the present disclosure will be described below in conjunction with the drawings. It should be noted that the embodiments involved in this description are not exhaustive and do not represent the exclusive embodiments of the present disclosure. The following corresponding examples are only for clearly illustrating the present disclosure content of the present disclosure, and are not intended to limit the embodiments of the present disclosure. For those of ordinary skill in the art, various changes and modifications can be made on the basis of the description of these embodiments, and any obvious changes or modifications that belong to the technical concept and invention content of the present disclosure shall fall in the protection scope of the present disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this disclosure, specify the presence of stated features, integers, steps, operations, elements, and/or components, but do not preclude the presence or addition of one or more other features, integers, steps, operations, elements, components, and/or groups thereof.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments in the present disclosure. It is to be expressly understood, the operations of the flowchart may be implemented not in order. Conversely, the operations may be implemented in inverted order, or simultaneously. Moreover, one or more other operations may be added to the flowcharts. One or more operations may be removed from the flowcharts.

Figure 1:
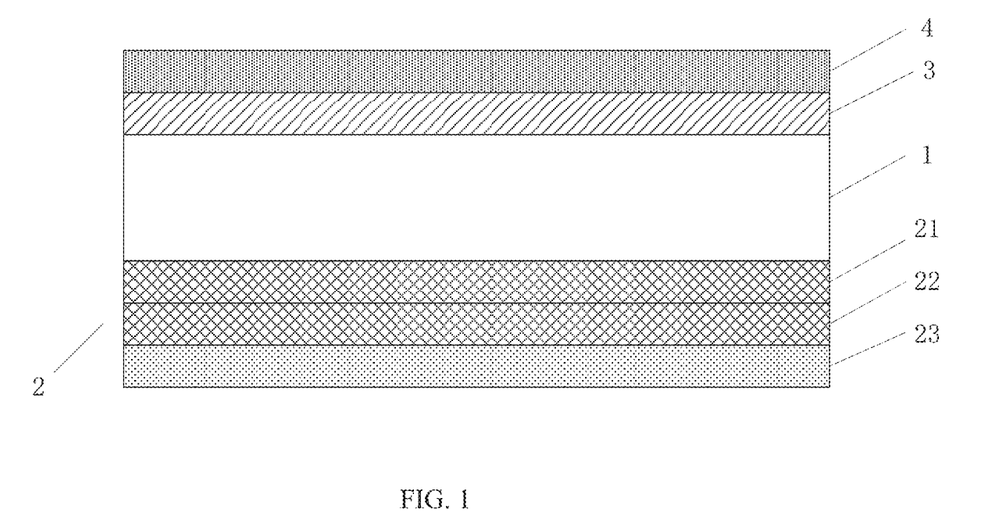
FIG. 1 is a schematic diagram illustrating an exemplary solar cell according to some embodiments of the present disclosure.

FIG. 1 is a schematic diagram illustrating a solar cell according to some embodiments of the present disclosure. As shown in FIG. 1, the solar cell includes a semiconductor layer 1 and a plurality of passivation layers 2 disposed on a back surface of the semiconductor layer 1. In some embodiments, the semiconductor layer 1 may include a silicon substrate. Exemplary silicon substrates may include but not limited to a monocrystalline silicon substrate or a polycrystalline silicon substrate. For example, the semiconductor layer 1 may include a monocrystalline silicon substrate. In some embodiments, the passivation layers 2 may include a first silicon oxynitride film layer 21, a second silicon oxynitride film layer 22 and a silicon nitride film layer 23. The first silicon oxynitride film layer 21 is provided on the back surface of the semiconductor layer 1, the second silicon oxynitride film layer 22 is provided on a surface of the first silicon oxynitride film layer 21, and the silicon nitride film layer 23 is provided on a surface of the second silicon oxynitride film layer 22. In some embodiments, there may be various sequences for respective layers of the passivation film stack (i.e., the plurality of passivation layers 2), which shall not be limited to the sequence shown in FIG. 1.

Alternatively or additionally, at least one silicon oxide layer (not shown in FIG. 1) may be formed between the first silicon oxynitride film layer 21 and the semiconductor layer 1. In some embodiments, a thickness of the at least one silicon oxide layer may be in a range from 1 nm to 10 nm. For example, a preferable thickness of the at least one silicon oxide layer may be in the range from 1 nm to 3 nm. In some embodiments, the silicon oxide layer may be part of the first silicon oxynitride film layer 21. In some embodiments. In some embodiments, the silicon oxide layer may be part of the semiconductor layer 1.

In some embodiments, the passivation layers 2 may be deposited by atomic layer deposition, chemical vapor deposition, plasma enhanced chemical vapor deposition, or physical deposition, etc.

In some embodiments, at least two layers of the passivation layers 2 have different refractive indexes with respect to each other. When designing the passivation layers, refractive index relation of individual layers should be fully considered.

In some embodiments, the first silicon oxynitride film layer 21 has a refractive index (also referred to as a first refractive index) that is greater than a refractive index (also referred to as a second refractive index) of the second silicon oxynitride film layer 22. In some embodiments, the first refractive index and the second refractive index satisfy a first relation. The first relation includes a ratio of the first refractive index to the second refractive index, ranging from 1.03 to 1.21. For example, the ratio of the first refractive index to the second refractive index may be 1.05, 1.10, 1.15, 1.20, and so on.

In some embodiments, the refractive index (i.e., the first refractive index) of the first silicon oxynitride film layer 21 is smaller than a refractive index (also referred to as a third refractive index) of the silicon nitride film layer 23. In some embodiments, the first refractive index and the third refractive index satisfy a second relation. The second relation includes a ratio of the first refractive index to the third refractive index, ranging from 0.79 to 0.87. For example, the ratio of the first refractive index to the third refractive index may be 0.80, 0.81, 0.82, 0.83, 0.84, 0.85, and so on.

In some embodiments, the refractive index (i.e., the second refractive index) of the second silicon oxynitride film layer 22 is smaller than the refractive index (i.e., the third refractive index) of the silicon nitride film layer 23. In some embodiments, the second refractive index and the third refractive index satisfy a third relation. The third relation includes a ratio of the second refractive index to the third refractive index, ranging from 0.72 to 0.77. For example, the ratio of the second refractive index to the third refractive index may be 0.73, 0.74, 0.75, 0.76, and so on.

In some embodiments, the first refractive index ranges from 1.62 to 1.71.

In some embodiments, the second refractive index ranges from 1.48 to 1.61.

In some embodiments, the third refractive index ranges from 2.08 to 2.11.

In some embodiments, the silicon nitride film layer 23 may include multiple sub-layers. For example, the silicon nitride film layer 23 may include one to three silicon nitride sub-layer(s), such as one, two, or three. In some embodiments, at least a portion of the silicon nitride sub-layers have different refractive indexes. For example, a refractive index of the first silicon nitride sub-layer is 2.08, a refractive index of the second silicon nitride sub-layer is 2.09, and a refractive index of the third silicon nitride sub-layer is 2.10. An overall refractive index of the multiple silicon nitride sub-layers ranges from 2.08 to 2.11.

In some embodiments, at least a portion of the passivation layers 2 (e.g., including 21, 22, 23) may have different thicknesses.

For example, a sum of a thickness (d1) of the first silicon oxynitride film layer 21 and a thickness (d2) of the second silicon oxynitride film layer 22 is greater than 60 nm, and a thickness (d3) of the silicon nitride film layer 23 is greater than 60 nm.

As another example, a sum of the thicknesses of all of the passivation layers 2 ranges from 120 nm to 300 nm.

As shown in FIG. 1, the solar cell further includes a diffusion layer 3 disposed on a front surface of the semiconductor layer 1. The diffusion layer 3 may include a phosphorus-doped diffusion layer or a boron-doped diffusion layer. For example, for a P-type semiconductor layer, the diffusion layer 3 is a phosphorus-doped diffusion layer. For an N-type semiconductor layer, the diffusion layer 3 is a boron-doped diffusion layer. A P-N junction between the diffusion layer 3 and the semiconductor layer 1 may be formed. In some embodiments, a thickness of the semiconductor layer 1 may be in a range from 160 μm to 220 μm.

Referring back to FIG. 1, an anti-reflection layer 4 is further provided on a surface of the diffusion layer 3. In some embodiments, the anti-reflection layer 4 may be composed of a multi-layer film structure, including but not limited to, an aluminum oxide film layer, a silicon nitride film layer, a silicon oxynitride film layer, or the like, or any combination thereof. In some embodiments, the anti-reflection layer 4 may include a film layer similar to or substantially the same as the passivation layers 2. The anti-reflection layer 4 can not only reduce the reflection of light incident onto the solar cell, but also passivate the surface of the solar cell. In some embodiments, the anti-reflection layer 4 may be referred to as a front passivation layer.

It should be noted that the front surface of the semiconductor layer 1 described herein may refer to a surface facing the sun, that is, a light-receiving surface. In a normal operating mode, sunlight directly hits the light-receiving surface. The back surface of the semiconductor layer 1 is a surface opposite to the light-receiving surface.

In some embodiments, the semiconductor layer 1 may include but not limited to a monocrystalline silicon substrate or a polycrystalline silicon substrate. For example, the semiconductor layer 1 is a monocrystalline silicon substrate. In some embodiments, a resistivity of the semiconductor layer 1 may be in a range from 0.5 Ω·cm to 3.5 Ω·cm. In some embodiments, the resistivity may be in a range from 0.5 Ω·cm to 2.5 Ω·cm. In some embodiments, the resistivity may be in a range from 2.5 Ω·cm to 3.5 Ω·cm. Alternatively, the resistivity of the semiconductor layer 1 is 2.0 Ω·cm.

In some embodiments, at least one back electrode may be disposed on the back surface of the semiconductor layer 1 (not shown in FIG. 1). At least a portion of the at least one back electrode may be disposed on the surface of the passivation layers 2, for example, disposed on the surface of the silicon nitride film layer(s) 23. The at least one back electrode may penetrate and/or partially penetrate through the passivation film stack 2 to form an ohmic contact with the semiconductor layer 1. For example, a conductive paste may be printed on the back surface of the semiconductor layer 1 by a screen printing technique, then be dried to form grid-shaped back electrodes. The conductive paste of the back electrodes may include a conductive silver paste with penetrability, which can penetrate through each layer of the passivation layers 2 after being sintered to be electrically connected to the semiconductor layer 1.

It can be understood that the passivation layer structure illustrated in FIG. 1 can be used to prepare various solar cells, such as a PERC solar cell, an interdigitated back contact (IBC) solar cell, a silicon heterojunction (SHJ) solar cell, an interdigitated back contact and heterojunction (HBC) solar cell, a tunnel oxide passivation contact (TOP- Con) solar cell, a polysilicon oxide selective passivation contact (POLO) solar cell, etc.

In some embodiments, at least one solar cell with the passivation layers 2 can be used to form a photovoltaic module. The photovoltaic module may include but not limited to a shingled photovoltaic module, a bifacial photovoltaic module, a multi-bus bar (MBB) photovoltaic module. For example, at least one cell string, which is composed of the at least one solar cell, may be provided. The at least one string may be operably connected via a conductive connection material, such as a conductive solder or a conductive adhesive. The lamination for the connected string may be operated with a back plate and an ethylene-vinyl acetate copolymer (EVA) in accordance with a certain sequence, then a frame may be installed to form the photovoltaic module. The at least one solar cell can be used to convert the received light energy to electrical energy. The photovoltaic module may further send the electrical energy to a load.

Compared with the solar cell that is passivated with a conventional passivation layer including $Al_2O_3$, the use of passivation film without $Al_2O_3$ can effectively enhance back passivation characteristics of the solar cell, reduce the PID of the photovoltaic module, and lower manufacturing costs. For example, the passivation layers 2 include a large number of hydrogen atoms, which can achieve a good passivation effect. Moreover, the presence of oxygen atoms can also enable silicon oxynitride to have a better interface quality on the silicon surface, which can solve the incompatible contradiction between reliability and lower manufacturing cost of the solar cells.

Figure 2:
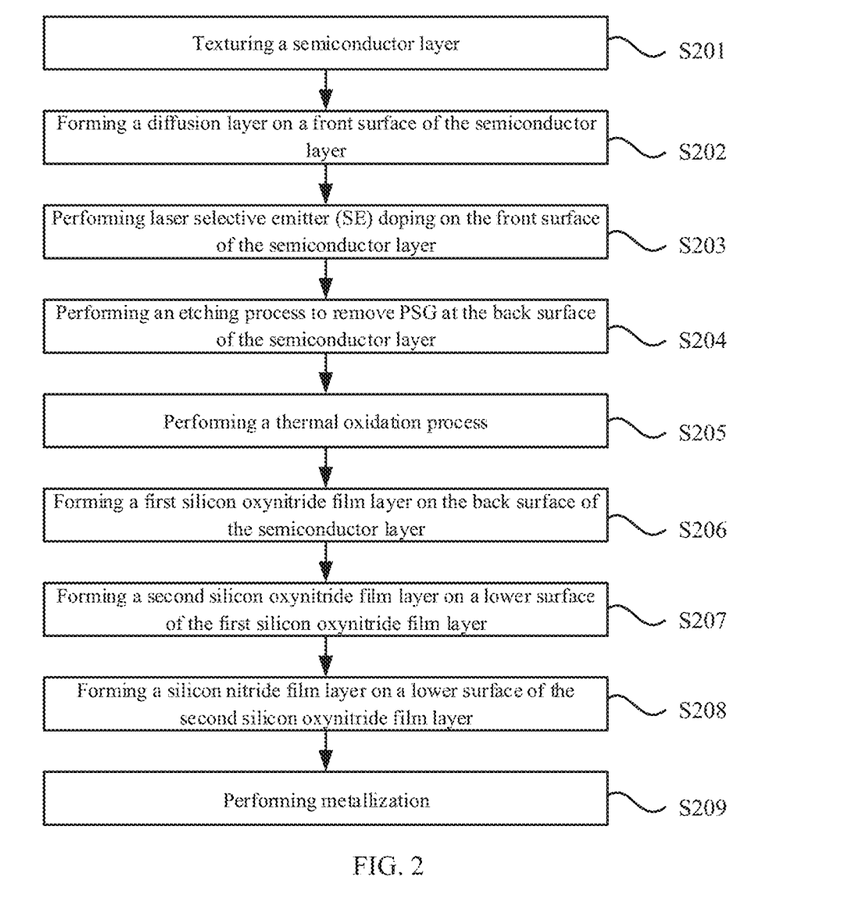
FIG. 2 is a flowchart illustrating a method for producing a solar cell according to some embodiments of the present disclosure.

FIG. 2 is a flowchart illustrating a method for producing a solar cell according to some embodiments of the present disclosure.

At S201, the semiconductor layer (e.g., the semiconductor layer 1 illustrated in FIG. 1) may be textured.

For example, the semiconductor layer 1 may be textured by a wet texturing process. In some embodiments, when the semiconductor layer includes a monocrystalline silicon, an alkaline solution, such as a potassium hydroxide solution, may be used for the texturing. In some embodiments, when the semiconductor layer includes polysilicon, an acid solution, such as a hydrofluoric acid solution, may be used for the texturing.

After the texturing, the surface (e.g., the front surface) of the semiconductor layer may have a textured structure. The exemplary textured structure may be a pyramid structure which have a light trapping effect, so as to increase the absorption of light incident onto the solar cell, thereby improving the efficiency of the solar cell.

In some embodiments, the semiconductor layer may be cleaned (e.g., through an ultrasonic cleaning) before the texturing, so as to remove impurities, such as metal and organic contaminants on the surface(s) of the semiconductor layer.

At S202, a diffusion layer (e.g., the diffusion layer 3 illustrated in FIG. 1) may be formed on a front surface of the semiconductor layer (e.g., a light-receiving surface of the semiconductor layer 1).

In some embodiments, the diffusion layer may include but not limited to a phosphorus-doped diffusion layer, a boron-doped diffusion layer. For example, when the diffusion layer is the phosphorus-doped diffusion layer, a sheet resistance of the diffusion layer ranges from 140Ω to 150Ω.

Merely for illustration, the semiconductor layer 1 may be placed in a tube-type diffusion furnace, phosphorus oxychloride is used as a dopant source, and a diffusion temperature is set at about 850° C. In the diffusion conditions, the phosphorus-doped diffusion layer may be formed and its sheet resistance ranges from 140Ω to 150Ω.

At S203, a laser selective emitter (SE) doping may be performed on the front surface of the semiconductor layer to form a lightly doped region and a heavily doped region. In some embodiments, the operation 203 can be omitted.

At S204, an etching process may be performed. The semiconductor layer may be etched using hydrofluoric acid in order to remove phosphorus silicon glass (PSG).

At S205, an oxidation process (e.g., thermal oxidation) may be performed. The thermal oxidation may be used to improve the passivation for the solar cell. In some embodiments, at least one silicon oxide layer may be deposited on the surface(s) of the semiconductor layer through the thermal oxidation process. In some embodiments, a thickness of the at least one silicon oxide layer may be in a range from 1 nm to 10 nm. For example, a preferable thickness of the at least one silicon oxide layer may be in the range from 1 nm to 3 nm.

In some embodiments, the passivation layers on the back surface of the semiconductor layer may be formed in accordance with operations S206-S208.

The passivation process be performed by at least one of plasma enhanced chemical vapor deposition (PECVD), atomic layer deposition (ALD), chemical vapor deposition (CVD) and physical vapor deposition (PVD), or the like.

At S206, a first silicon oxynitride film layer may be formed on the back surface of the semiconductor layer. In some embodiments, the first silicon oxynitride film layer may be disposed on the surface of the silicon oxide layer. In some embodiments, the silicon oxide layer may be part of the first silicon oxynitride film layer.

In some embodiments, the first silicon oxynitride film layer includes a film with a high first refractive index, and the first refractive index ranges from 1.62 to 1.71. In some embodiments, the first silicon oxynitride film layer is prepared by PECVD in accordance with first preparation conditions. The first preparation conditions may include reactants, at least one flow rate of the reactants, a power for the preparation, a deposition temperature for the preparation, or the like, or any combination thereof. Specifically, the reactants may include silane, nitrous oxide and ammonia. The flow rate of the silane ranges from 310 sccm to 380 sccm, the flow rate of the nitrous oxide ranges from 5000 sccm to 6000 sccm, the flow rate of the ammonia ranges from 1600 sccm to 2600 sccm. The deposition temperature ranges from 480° C. to 510° C. The power ranges from 9000 W to 9500 W.

In some embodiments, under the preparation conditions, a thickness of the first silicon oxynitride film layer ranges from 10 nm to 60 nm. The first refractive index of the first silicon oxynitride film layer ranges from 1.62 to 1.68. In some embodiments, the first refractive index of the first silicon oxynitride film layer ranges from 1.64 to 1.67. In some embodiments, a preferred thickness of the first silicon oxynitride film layer ranges from 30 nm to 40 nm.

At S207, a second silicon oxynitride film layer may be formed on a lower surface of the first silicon oxynitride film layer.

In some embodiments, the second silicon oxynitride film layer may include a film with a low second refractive index, and the second refractive index ranges from 1.48 to 1.61. In some embodiments, the second silicon oxynitride film layer is prepared by PECVD in accordance with second preparation conditions. The second preparation conditions may include second reactants, at least one flow rate of the second reactants, a second power for the preparation, a second deposition temperature for the preparation, or the like, or any combination thereof. Specifically, the second reactants may include silane, nitrous oxide and ammonia. The flow rate of the silane ranges from 280 sccm to 320 sccm, the flow rate of the nitrous oxide ranges from 6000 sccm to 700 sccm, and the flow rate of the ammonia ranges from 300 sccm to 800 sccm. The second deposition temperature ranges from 480° C. to 510° C. The second power ranges from 9000 W to 9500 W.

Merely for illustration, under the preparation conditions, the thickness of the second silicon oxynitride film layer ranges from 20 nm to 60 nm. In some embodiments, the second refractive index of the second silicon oxynitride film layer ranges from 1.54 to 1.58. In some embodiments, the second refractive index of the second silicon oxynitride film layer ranges from 1.55 to 1.57. In some embodiments, a preferred thickness of the second silicon oxynitride film layer ranges from 40 nm to 50 nm.

At S208, a silicon nitride film layer may be formed on a lower surface of the second silicon oxynitride film layer. The silicon nitride film layer may be considered as an outermost layer of the passivation layers (e.g., the passivation layers 2) on the back surface of the semiconductor layer. In some embodiments, the silicon nitride film layer includes one silicon nitride film, and the third refractive index of the silicon nitride film ranges from 2.08 to 2.11. In some embodiments, the silicon nitride film layer includes a plurality of silicon nitride films. For example, the silicon nitride film layer may include three film layers with a gradient-varied refractive index. The overall third refractive index of the silicon nitride films ranges from 2.08 to 2.11. In some embodiments, the silicon nitride film layer is prepared by PECVD in accordance with third preparation conditions. The third preparation conditions may include third reactants, at least one flow rate of the third reactants, a third power for the preparation, a third deposition temperature for the preparation, or the like, or any combination thereof. Specifically, the third reactants may include silane and ammonia. The flow rate of the silane ranges from 800 sccm to 1420 sccm, and the flow rate of the ammonia ranges from 4000 sccm to 10000 sccm. The third deposition temperature ranges from 480° C. to 510° C. The third power ranges from 8500 W to 9500 W.

Merely for illustration, under the preparation conditions, the thickness of the silicon nitride film layer ranges from 60 nm to 180 nm. In some embodiments, the third refractive index of the silicon nitride film layer(s) ranges from 2.08 to 2.11. In some embodiments, the third refractive index ranges from 2.09 to 2.10. In some embodiments, a preferred thickness of the silicon nitride film layer ranges from 80 nm to 100 nm.

At S209, metallization may be performed on a silicon wafer after being processed in operations S208. Herein the silicon wafer at least includes the prepared passivation layers and the semiconductor layer. During the S209, at least one portion of the prepared passivation layers may be removed to form a metallization region, for example, through a laser grooving technique. At least one electrode may be formed using screen printing technique. For example, front and back electrodes of the solar cell may be formed.

In some embodiments, for the solar cell produced by the method illustrated in FIG. 2, a sum of the thicknesses of the first silicon oxynitride film layer and the second silicon oxynitride film layer is greater than 60 nm, the thickness of the silicon nitride film layer(s) is greater than 60 nm, and a sum of the thicknesses of the passivation layers is greater than 120 nm and smaller than 300 nm. The first refractive index of the first silicon oxynitride film layer is greater than the second refractive index of the second silicon oxynitride film layer and smaller than the third refractive index of the silicon nitride film layer. In some embodiments, a ratio of the first refractive index to the second refractive index ranges from 1.03 to 1.21. In some embodiments, a ratio of the first refractive index to the third refractive index ranges from 0.79 to 0.87. In some embodiments, a ratio of the second refractive index to the third refractive index ranges from 0.72 to 0.77.

Compared with a solar cell that is not passivated by multiple layers of silicon oxynitride and silicon nitride, in the solar cells (such as the PERC cell) disclosed herein, the back surface of the semiconductor layer is passivated with silicon oxynitride and silicon nitride, thereby effectively enhancing the back passivation characteristics and greatly improving performances of the solar cell in minority carrier lifetime, open-circuit voltage, short-circuit current, filling factors, and cell efficiency.

Merely for illustration, a first solar cell having passivation with silicon nitride, a second solar cell having passivation with aluminum oxide and silicon oxide, and a third solar cell having passivation with multiple layers of silicon oxynitride and silicon nitride described in the present disclosure are tested under the same conditions. The test data is shown in Table 1. It can be seen that the efficiency of the third solar cell is better than either first solar cell or the second solar cell.

TABLE 1

| Item | Minority carrier life time (us) | Open-circuit voltage (Voc, V) | Short-circuit current (Isc, A) | Filling factors (FF, %) | Efficiency (Eta, %) |
|---|---|---|---|---|---|
| Passivation with silicon nitride | 0 | 0 | 0 | 0 | 0 |
| Passivation with aluminum oxide and silicon oxide | +150 | +0.55 | +0.850 | +0.20 | +3.493 |
| Passivation with silicon oxynitride and silicon nitride | +170 | +0.057 | +0.840 | +0.21 | +3.534 |

The relation between the thicknesses and refractive indexes of the silicon oxynitride/silicon nitride film layers and the cell efficiency of the solar cell of the present disclosure will be described in details with reference to specific examples.

Figure 3:
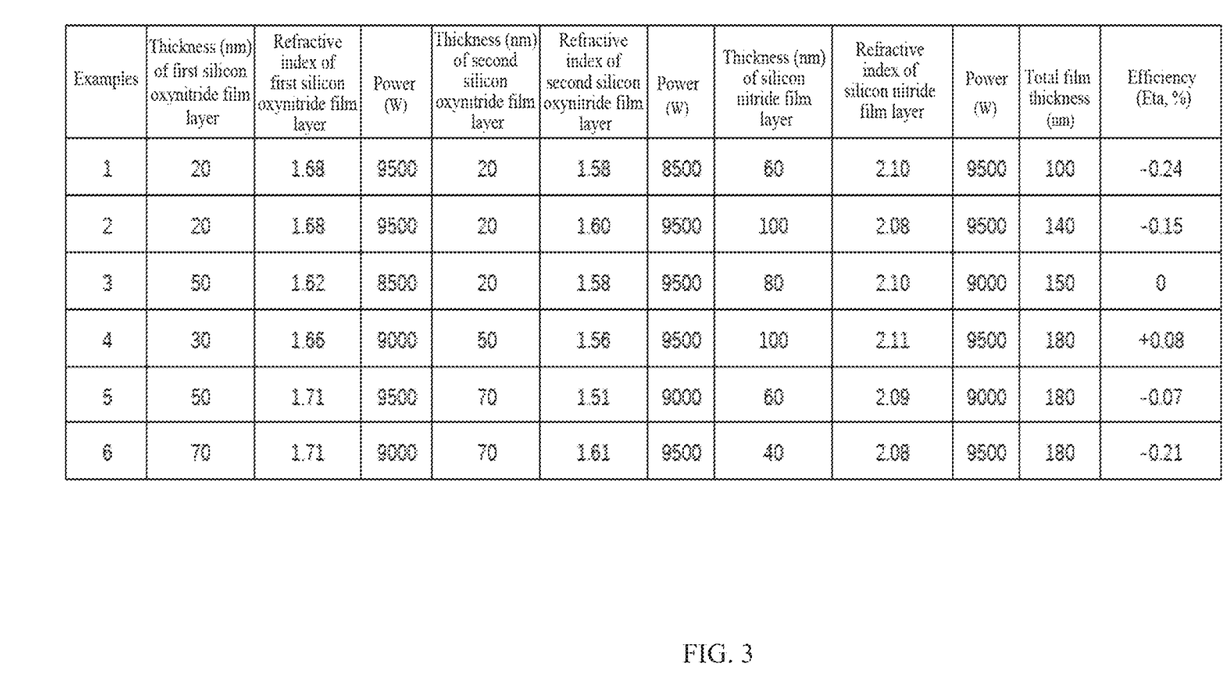
FIG. 3 shows exemplary data related to a solar cell according to some embodiments of the present disclosure.

FIG. 3 shows relevant exemplary data related to the solar cell.

As illustrated in FIG. 3, in some embodiments, the thicknesses of the silicon oxynitride film layers (i.e., a sum of the thicknesses of the first and second silicon oxynitride film layers) is greater than 60 nm; the thickness of the silicon nitride film layer is greater than 60 nm; and a sum of the thicknesses of the silicon oxynitride film layers and the silicon nitride film laver is greater than 120 nm and smaller than 300 nm.

In some embodiments, the ratio of the first refractive index to the second refractive index ranges from 1.03 to 1.21. The ratio of the first refractive index to the third refractive index ranges from 0.79 to 0.87. The ratio of the first refractive index to the third refractive index ranges from 0.72 to 0.77.

When the thicknesses and/or refractive indexes of the passivation layers satisfy the foregoing ranges, the cell efficiency can be improved.

Figure 4:
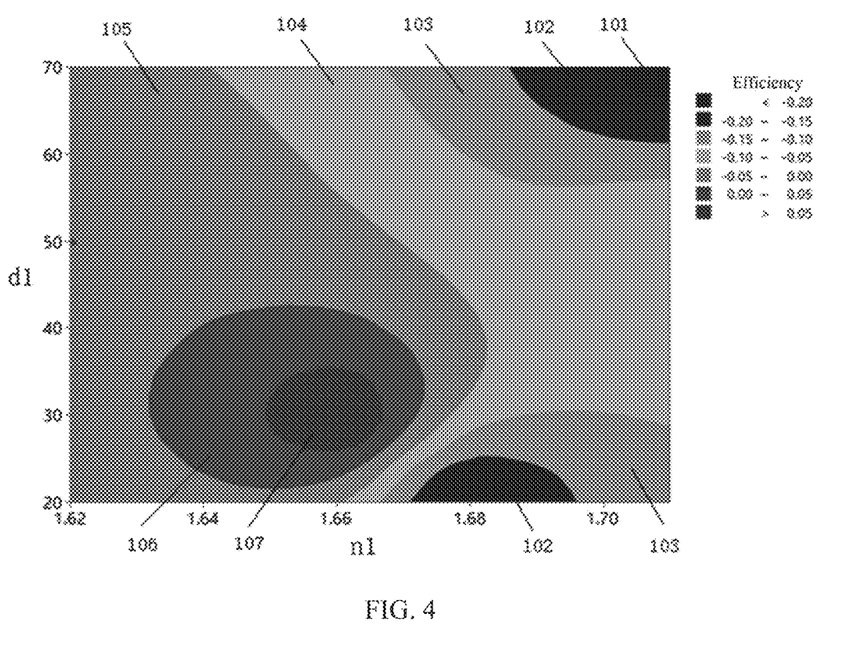
FIG. 4 is a contour map for a cell efficiency, a thickness and a refractive index of a first silicon oxynitride film layer of a solar cell according to some embodiments of the present disclosure.

In some embodiments, the cell efficiency may be correlated with the thickness (d1) of the first silicon oxynitride film and the corresponding first refractive index (n1). In some embodiments, the cell efficiency may be proportional to (11.2+0.088 d1×n1−0.147×d−6.7×n1). Merely for illustration, FIG. 4 shows a contour map for the cell efficiency, the thickness d1 and the refractive index n1 of the first silicon oxynitride film layer according to some embodiments of the present application. As shown in FIG. 4, a horizontal axis denotes the refractive index n1, and a vertical axis denotes the thickness d1. Different color areas indicate different cell efficiencies, and the color areas are represented by reference numerals 101-107, respectively. The seven color blocks from top to bottom correspond to the color areas represented by 101 to 107, respectively. For example, the color area represented by 101 indicates that the cell efficiency range is smaller than −0.20. As another example, the color area represented by 107 indicates that the cell efficiency range is greater than 0.05. As illustrated in FIG. 4, when n1 ranges from 1.62 to 1.68 and d1 is in a preferred range from 30 nm to 40 nm, a relatively high cell efficiency can be achieved.

Figure 5:
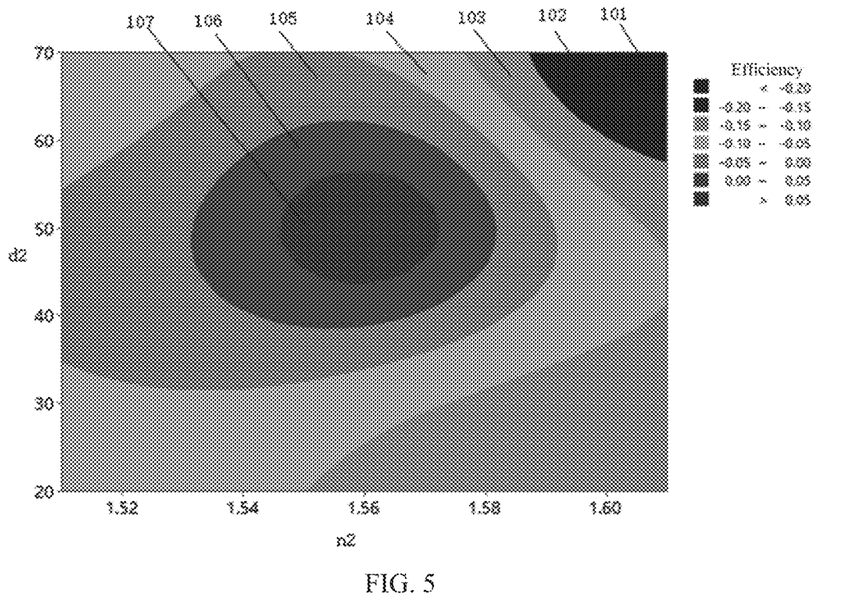
FIG. 5 is a contour map for a cell efficiency and a thickness and a refractive index of a second silicon oxynitride film layer of a solar cell according to some embodiments of the present disclosure.

In some embodiments, the cell efficiency may be correlated with the thickness (d2) and the second refractive index (n2) of the second silicon oxynitride film. In some embodiments, the cell efficiency may be proportional to (2.65−0.00059×d2−1.73×n2). Merely for illustration, FIG. 5 shows a contour map for the cell efficiency of the solar cell, the thickness d2 and refractive index n2 of the second silicon oxynitride film layer according to some embodiments of the present disclosure. As shown in FIG. 5, the horizontal axis denotes the refractive index n2, and the vertical axis denotes the film thickness d2. Different color areas represent different cell efficiencies, and the color areas are represented by reference numerals 101-107, respectively. The seven color blocks from top to bottom correspond to the color areas represented by 101 to 107, respectively. For example, the color area represented by 101 indicates that the cell efficiency range is smaller than −0.20. As another example, the color area represented by 107 indicates that the cell efficiency range is greater than 0.05. As illustrated in FIG. 5, when n2 ranges from 1.54 to 1.58, and d2 is in a preferred range from 40 nm to 50 nm, a relatively high cell efficiency can be achieved.

It can be understood that, for forming the passivation layers of the solar cell, the passivation layers can be designed based on the relation between the thicknesses and the refractive indexes of the passivation layers, in order to obtain a film structure with better passivation performance for improving the cell efficiency. In addition, compared with the solar cell that is passivated with a conventional passivation layer including $Al_2O_3$, the designed passivation film without $Al_2O_3$ can effectively enhance the back passivation characteristics of the solar cell. For example, the passivation layers include a large number of hydrogen atoms, which can achieve a good passivation effect. Moreover, the presence of oxygen atoms can also enable silicon oxynitride to have a better interface quality on the silicon surface, which can solve the incompatible contradiction between reliability and lower manufacturing costs of the solar cells.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

What is claimed is:

1. A solar cell, comprising:
   a semiconductor layer; and
   a plurality of passivation layers provided on a back surface of the semiconductor layer,
   wherein the plurality of passivation layers include:
      a first silicon oxynitride film layer having a first refractive index;
      a second silicon oxynitride film layer having a second refractive index and provided on a surface of the first silicon oxynitride film layer; and
      at least one silicon nitride film layer having a third refractive index and provided on a surface of the second silicon oxynitride film layer,
   wherein a sum of thicknesses of the first silicon oxynitride film layer and the second silicon oxynitride film layer is greater than 70 nm, a thickness of the at least one silicon nitride film layer is greater than 60 nm, a sum of thicknesses of the plurality of passivation layers is greater than 130 nm and smaller than 300 nm, and the first refractive index is greater than the second refractive index and smaller than the third refractive index,
   wherein a thickness of the first silicon oxynitride film layer ranges from 30 nm to 40 nm, and the first refractive index ranges from 1.64 to 1.67, and
   wherein a thickness of the second silicon oxynitride film layer ranges from 40 nm to 60 nm, and the second refractive index ranges from 1.54 to 1.58.

2. The solar cell according to claim 1, wherein a ratio of the first refractive index to the third refractive index ranges from 0.79 to 0.87.

3. The solar cell according to claim 1, wherein a ratio of the second refractive index to the third refractive index ranges from 0.72 to 0.77.

4. The solar cell according to claim 1, wherein the third refractive index range ranges from 2.08 to 2.11.

5. A photovoltaic module, comprising: at least one solar cell configured to convert received light energy into electrical energy, each of the at least one solar cell including:
   a semiconductor layer; and
   a plurality of passivation layers provided on a back surface of the semiconductor layer,
   wherein the plurality of passivation layers include:
      a first silicon oxynitride film layer having a first refractive index;
      a second silicon oxynitride film layer having a second refractive index and provided on a surface of the first silicon oxynitride film layer; and
      at least one silicon nitride film layer having a third refractive index and provided on a surface of the second silicon oxynitride film layer,
   wherein a sum of thicknesses of the first silicon oxynitride film layer and the second silicon oxynitride film layer is greater than 70 nm, a thickness of the at least one silicon nitride film layer is greater than 60 nm, a sum of thicknesses of the plurality of passivation layers is greater than 130 nm and smaller than 300 nm, and the first refractive index is greater than the second refractive index and smaller than the third refractive index, wherein a thickness of the first silicon oxynitride film layer ranges from 30 nm to 40 nm, and the first refractive index ranges from 1.64 to 1.67, and wherein a thickness of the second silicon oxynitride film layer ranges from 40 nm to 60 nm, and the second refractive index ranges from 1.54 to 1.58.

6. The photovoltaic module according to claim 5, wherein a ratio of the first refractive index to the third refractive index ranges from 0.79 to 0.87.

7. The photovoltaic module according to claim 5, wherein a ratio of the second refractive index to the third refractive index ranges from 0.72 to 0.77.

8. A method for producing a solar cell, comprising:

sequentially depositing a first silicon oxynitride film layer having a first refractive index, a second silicon oxynitride film layer having a second refractive index, and at least one silicon nitride film layer having a third refractive index on a back surface of a semiconductor layer to form passivation layers, wherein a sum of thicknesses of the first silicon oxynitride film layer and the second silicon oxynitride film layer is greater than 70 nm, a thickness of the at least one silicon nitride film layer is greater than 60 nm, a sum of thicknesses of the plurality of passivation layers is greater than 130 nm and smaller than 300 nm, and the first refractive index is greater than the second refractive index and smaller than the third refractive index, wherein a thickness of the first silicon oxynitride film layer ranges from 30 nm to 40 nm, and the first refractive index ranges from 1.64 to 1.67, and wherein a thickness of the second silicon oxynitride film layer ranges from 40 nm to 60 nm, and the second refractive index ranges from 1.54 to 1.58.

9. The method according to claim 8, wherein the first silicon oxynitride film layer is deposited using reactants including silane, nitrous oxide, and ammonia, wherein a flow rate of the silane ranges from 310 sccm to 380 sccm, a flow rate of the nitrous oxide ranges from 5000 sccm to 6000 sccm, a flow rate of the ammonia ranges from 1600 sccm to 2600 sccm, a deposition temperature ranges from 480° C. to 510° C., and a power ranges from 9000 W to 9500 W.

10. The method according to claim 8, wherein the second silicon oxynitride film layer is deposited using reactants including silane, nitrous oxide, and ammonia as, wherein a flow rate of the silane ranges from 280 sccm to 320 sccm, a flow rate of the nitrous oxide ranges from 6000 sccm to 7000 sccm, a flow rate of the ammonia ranges from 300 sccm to 800 sccm, a deposition temperature ranges from 480° C. to 510° C., and a power ranges from 9000 W to 9500 W.

11. The method according to claim 8, wherein the at least one silicon nitride film layer is deposited using reactants including silane and ammonia as reactants, wherein a flow rate of the silane ranges from 800 sccm to 1420 sccm, a flow rate of the ammonia ranges from 4000 sccm to 10000 sccm, a deposition temperature ranges from 480° C. to 510° C., and a power ranges from 8500 W to 9500 W.

12. The method according to claim 8, wherein a ratio of the first refractive index to the third refractive index ranges from 0.79 to 0.87.

13. The method according to claim 8, wherein a ratio of the second refractive index to the third refractive index ranges from 0.72 to 0.77.

* * * * *